(12) United States Patent
Fuller et al.

(10) Patent No.: US 7,935,637 B2
(45) Date of Patent: May 3, 2011

(54) RESIST STRIPPING METHODS USING BACKFILLING MATERIAL LAYER

(75) Inventors: Nicholas C. M. Fuller, North Hills, NY (US); Sivananda Kanakasabapathy, Hopewell Junction, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 888 days.

(21) Appl. No.: 11/839,934

(22) Filed: Aug. 16, 2007

(65) Prior Publication Data

US 2009/0047784 A1   Feb. 19, 2009

(51) Int. Cl.
*H01L 21/302* (2006.01)
*H01L 21/461* (2006.01)

(52) U.S. Cl. ......... 438/706; 438/691; 438/694; 438/689
(58) Field of Classification Search .................. None
See application file for complete search history.

(56) References Cited

U.S. PATENT DOCUMENTS

| | | | |
|---|---|---|---|
| 6,777,173 B2 | 8/2004 | Chen et al. | |
| 7,083,903 B2 | 8/2006 | Edelberg et al. | |
| 2001/0050266 A1* | 12/2001 | Sherrer et al. | 216/24 |
| 2003/0119237 A1* | 6/2003 | Chittipeddi et al. | 438/199 |
| 2004/0157140 A1 | 8/2004 | Kamata et al. | |
| 2005/0112883 A1 | 5/2005 | Savas et al. | |
| 2005/0258406 A1 | 11/2005 | Onishi et al. | |
| 2007/0054492 A1 | 3/2007 | Elliott et al. | |

* cited by examiner

*Primary Examiner* — Nadine G. Norton
*Assistant Examiner* — Stephanie Duclair
(74) *Attorney, Agent, or Firm* — Scully, Scott, Murphy & Presser, P.C.; Louis J. Percello, Esq.

(57) ABSTRACT

A method for fabricating a microelectronic structure provides for forming a backfilling material layer at least laterally adjacent, and preferably laterally adjoining, a resist layer located over a substrate. Preferably, the resist layer comprises a surface treated resist layer. Optionally, the backfilling material layer may be surface treated similarly to the surface treated resist layer. Under such circumstances: (1) surface portions of the backfilling material layer and resist layer; and (2) remaining portions of the backfilling material layer and resist layer, may be sequentially stripped using a two step etch method, such as a two step plasma etch method. Alternatively, a surface portion of the surface treated resist layer only may be stripped while using a first etch method, and the remaining portions of the resist layer and backfilling material layer may be planarized prior to being simultaneously stripped while using a second etch method.

19 Claims, 12 Drawing Sheets

RESIST STRIPPING METHODS USING BACKFILLING MATERIAL LAYER

BACKGROUND

1. Field of the Invention

The invention relates generally to resist layers that are used for fabricating microelectronic structures. More particularly, the invention relates to methods for efficiently stripping resist layers that are used for fabricating microelectronic structures.

2. Description of the Related Art

Resist layers are commonly used for fabricating microelectronic structures located over microelectronic substrates, including in particular semiconductor structures located over semiconductor substrates. To that end, resist layers are often used as mask layers for selectively processing portions of a microelectronic structure or a semiconductor structure. Such selective processing of the portions of the microelectronic structure or the semiconductor structure may include, but are not necessarily limited to, selective ion implantation processing, selective deposition processing and selective etch processing.

As a result of such selective processing of a microelectronic structure while using a resist layer as a mask layer, the resist layer is often processed in a fashion that makes the resist layer difficult to subsequently remove while using conventional resist stripping methods and materials.

In that regard, various methods and materials for stripping resist layers from microelectronic structures are known in the microelectronic fabrication art.

For example, Chen et al., in U.S. Pat. No. 6,777,173, teaches a method for stripping from over a substrate a resist layer that has been used as an ion implant mask layer. This particular method uses moisture as an etchant gas for stripping the resist layer from over the substrate.

In addition, Savas et al., in U.S. Pub. No. 2005/0112883, teaches another method for stripping a resist layer from over a substrate. This particular method uses hydrogen as an etchant gas when stripping the resist layer from over the substrate.

Further, Edelberg et al., in U.S. Pat. No. 7,083,903, teaches in particular a method for stripping a carbon rich surface layer of a resist layer from over a substrate selectively with respect to an inorganic layer that is also located over the substrate. This particular method uses a hydrofluorocarbon etchant gas for stripping the resist layer from over the substrate.

Finally, Elliott et al., in U.S. Pub. No. 2007/0054492, teaches yet another method for stripping from over a substrate a resist layer that has been used as an ion implant mask layer. This particular method uses a laser assisted activation of an etchant gas.

The use of resist layers as mask layers for purposes of selectively processing microelectronic layers and microelectronic structures, such as but not limited to semiconductor layers and semiconductor structures, is certain to remain prevalent within the microelectronic fabrication art. In light of that consideration, desirable are methods and materials that provide for efficient stripping of resist layers that are used for fabricating microelectronic layers and microelectronic structures.

SUMMARY

The invention provides a plurality of methods for stripping a resist layer that has generally, but not necessarily exclusively, been used as a mask layer for fabricating a microelectronic structure over a microelectronic substrate, such as a semiconductor structure over a semiconductor substrate. The methods use a "dummy" backfilling material layer at least adjacent, and preferably adjoining, the resist layer. The invention intends that the backfilling material layer is located at least laterally (i.e., at least horizontally rather than at least vertically) adjacent, and preferably laterally adjoining, the resist layer. The backfilling material layer may be subject to analogous, equivalent or identical processing as the resist layer. At least portions of the backfilling material layer and the resist layer (i.e., preferably multiple sequential vertical portions of the backfilling material layer and the resist layer) may be stripped simultaneously from the microelectronic substrate. The backfilling material layer is intended to protect portions of the microelectronic structure and the microelectronic substrate that would otherwise be exposed when stripping the resist layer in absence of the backfilling material layer from over the microelectronic substrate.

A particular method in accordance with the invention includes forming a backfilling material layer at least laterally adjacent a surface treated resist layer located over a substrate. This particular method also includes surface treating the backfilling material layer to form a surface treated backfilling material layer. This particular method also includes stripping simultaneously the resist layer and the backfilling material layer from over the substrate.

Another particular method in accordance with the invention includes forming a backfilling material layer at least laterally adjacent a surface treated resist layer located over a substrate. This particular method also includes surface treating the backfilling material layer to provide a surface treated backfilling material layer at least laterally adjacent the surface treated resist layer. This particular method also includes stripping simultaneously a surface layer of the surface treated resist layer and a surface layer of the surface treated backfilling material layer while using a first etch method. This particular method also includes stripping simultaneously a remainder of the resist layer and a remainder of the backfilling material layer while using a second etch method.

Yet another particular method in accordance with the invention includes forming a backfilling material layer at least laterally adjacent a surface treated resist layer located over a substrate. This particular method also includes stripping a surface layer from the surface treated resist layer while using the backfilling material layer as a mask over the laterally adjacent portion of the substrate while using a first etch method. This particular method also includes planarizing a remaining portion of the surface treated resist layer and a remaining portion of the backfilling material layer located over the substrate. This particular method also includes stripping simultaneously the remaining planarized portions of the resist layer and the backfilling material layer from over the substrate while using a second etch method.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a plurality of methods for stripping a resist layer from over a microelectronic substrate, is understood within the context of the description set forth below. The description set forth below is understood within the context of the drawings described above. Since the drawings are intended for illustrative purposes, the drawings are not necessarily drawn to scale.

Figure 1:
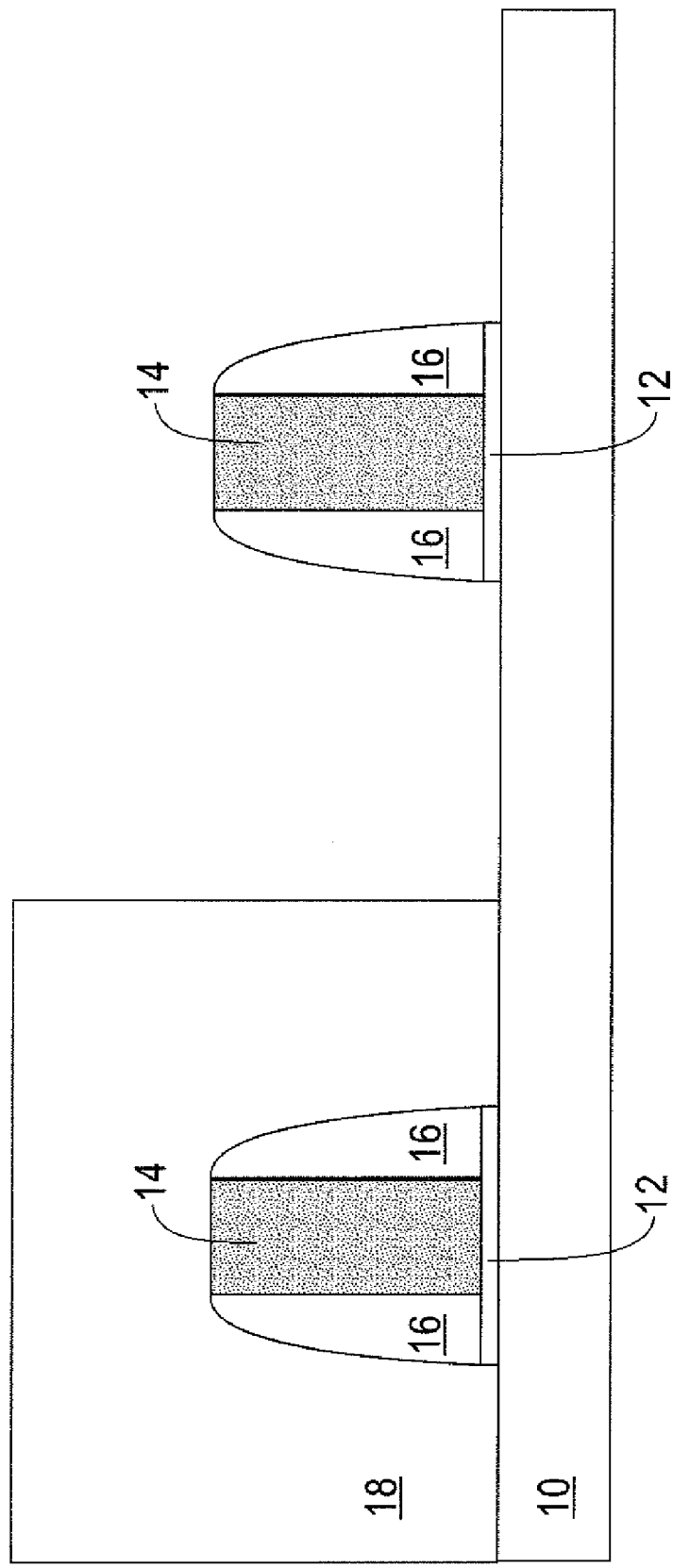
FIG. 1 to FIG. 7 show a series of schematic cross-sectional diagrams illustrating the results of progressive stages in fabricating a semiconductor structure in accordance with a particular embodiment of the invention.

FIG. 1 to FIG. 7 show a series of schematic cross-sectional diagrams illustrating the results of progressive stages in fabricating a semiconductor structure in accordance with a particular embodiment of the invention. This particular embodiment of the invention comprises a first embodiment of the invention. FIG. 1 shows a schematic cross-sectional diagram of the semiconductor structure at an early stage in the fabrication thereof in accordance with this particular first embodiment.

FIG. 1 shows a semiconductor substrate 10. A plurality of gate dielectrics 12 is located separated upon the semiconductor substrate 10. A plurality of gate electrodes 14 is located upon the plurality of gate dielectrics 12. A plurality of spacers 16 (i.e., illustrated as plural layers in cross-section but intended as a single layer encircling each gate electrode 14 in plan-view) is located adjoining the sidewalls of each gate electrode 14. Finally, a resist layer 18 is located covering a left hand gate electrode 14, but not a right hand gate electrode 14, within the semiconductor structure.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 comprises a silicon, germanium or silicon and germanium containing semiconductor material that has a thickness from about 0.1 to about 2 mm.

Although the instant embodiment illustrates the invention, at least implicitly, within the context of a bulk semiconductor substrate as the semiconductor substrate 10, neither the embodiment nor the invention is intended to be so limited. Rather the embodiment and the invention also contemplate the use of other than a bulk semiconductor substrate for the semiconductor substrate 10. Also, the embodiment additionally contemplates in place of the semiconductor substrate 10 a substrate that comprises other than a semiconductor material. Substrates that comprise other than a semiconductor material may include, but are not necessarily limited to ceramic substrates, glass substrates and glass-ceramic substrates. Semiconductor substrates other than bulk semiconductor substrates may include, but are not necessarily limited to, semiconductor-on-insulator substrates and hybrid orientation substrates.

Semiconductor-on-insulator substrates include a surface semiconductor layer separated from a base semiconductor substrate by a buried dielectric layer. The surface semiconductor layer and the base semiconductor substrate may comprise the same or different semiconductor materials with respect to semiconductor material composition, crystallographic orientation, dopant polarity and dopant concentration. Hybrid orientation substrates include multiple semiconductor regions of different crystallographic orientation supported by a single semiconductor substrate. Semiconductor-on-insulator substrates and hybrid orientation substrates may be fabricated using any of several methods. Non-limiting examples include layer transfer methods, layer lamination methods and separation by implantation of oxygen methods.

The gate dielectrics 12 may comprise conventional dielectric materials such as but not limited to oxides, nitrides and oxynitrides of silicon that have a dielectric constant from about 4 to about 20, measured in vacuum. Alternatively, the gate dielectrics 12 may comprise generally higher dielectric constant gate dielectric materials having a dielectric constant from about 20 to at least about 100. Such higher dielectric constant gate dielectric materials may include, but are not limited to hafnium oxides, hafnium silicates, titanium oxides, barium-strontium-titantates (BSTs) and lead-zirconate-titanates (PZTs). The gate dielectrics 12 may be formed using any of several methods that are appropriate to their material (or materials) of composition. Included but not limiting are thermal or plasma oxidation or nitridation methods, chemical vapor deposition methods and physical vapor deposition methods. Typically, the gate dielectrics 12 comprise a thermal silicon oxide gate dielectric material that has a generally conventional thickness.

The gate electrodes 14 may comprise materials including but not limited to certain metals, metal alloys, metal nitrides and metal silicides, as well as laminates thereof and composites thereof. The gate electrodes 14 may also comprise doped polysilicon and SiGe materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as but not limited to evaporative methods and sputtering methods. Typically, the gate electrodes 14 comprise a doped polysilicon material that has a generally conventional thickness from about 300 to about 1000 angstroms.

The spacers 16 may comprise materials including but not limited to conductor materials and dielectric materials. Conductor spacer materials are less common, but are nonetheless known. Dielectric spacer materials, such as but not limited to silicon oxide, silicon nitride and silicon oxynitride dielectric materials, are more common. The spacer materials may be formed using methods including but not limited to thermal or plasma oxidation or nitridation methods, chemical vapor deposition methods and physical vapor deposition methods. The spacers 16 are also formed with the distinctive inward pointing spacer shape by using a blanket layer deposition and anisotropic etchback method. Typically, the spacers 16 comprise a silicon oxide, silicon nitride or silicon oxynitride dielectric material, a laminate of those dielectric materials or a composite of those dielectric materials.

Finally, the resist layer 18 comprises a resist material. Candidate resist materials from which may be comprised the resist layer 18 include positive resist materials, negative resist materials and hybrid resist materials that possess properties of both positive resist materials and negative resist materials. Typically, the resist layer 18, which may under certain circumstances be characterized as a bulk resist layer or a block resist layer, comprises a positive resist material or a negative resist material that is located and formed to a thickness from about 1000 to about 3000 angstroms covering the left hand gate electrode 14.

Figure 2:
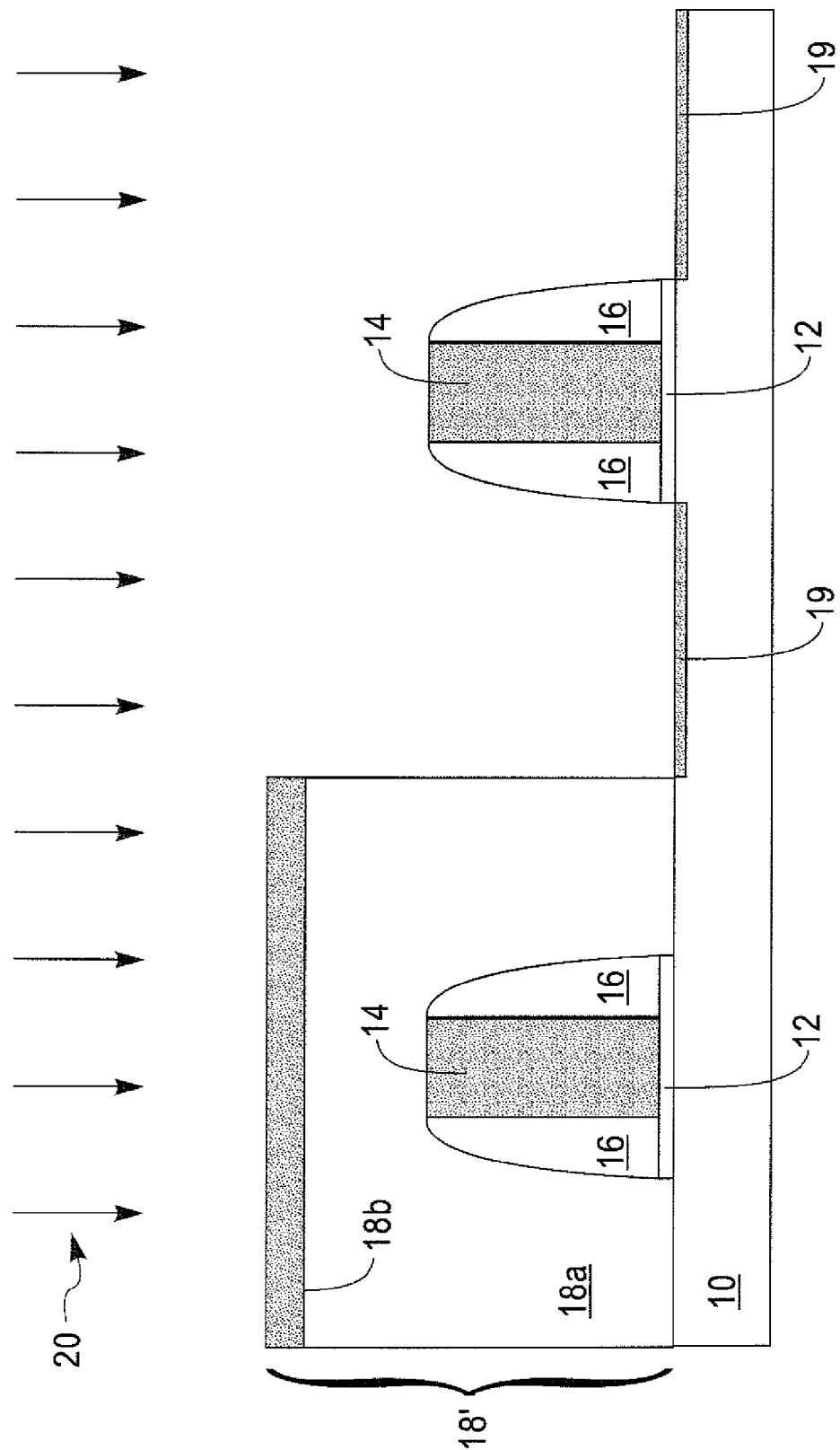

FIG. 2 shows the results of further processing of the semiconductor structure of FIG. 1. FIG. 2 shows a first implanting ion beam 20 that is used to implant a plurality of source/drain regions 19 into the semiconductor substrate 10 while using the resist layer 18, the right hand spacer 16 and the right hand gate electrode 14 as a mask. The first implanting ion beam 20 typically includes dopant implanting ions such as but not limited to arsenic, boron and phosphorus dopant implanting ions. Other non-dopant implanting ions, such as but not limited to silicon, germanium, argon and xenon non-dopant implanting ions, are not excluded. Typically, the first implanting ion beam 20 provides an implanting ion dose from about 1E13 to about 1E16 implanting ions per square centimeter when forming the source/drain regions 19 into the semiconductor substrate 10.

As a result of forming the source/drain regions 19 into the semiconductor substrate 10, the resist layer 18 that is illustrated in FIG. 1 is also modified to form a resist layer 18' that comprises a base resist layer 18a and an ion implanted resist layer 18b (i.e., an ion implanted surface resist layer) located upon the base resist layer 18a. The ion implanted resist layer 18b will typically have a thickness from about 100 to about 2000 angstroms. In general, the embodiments, including the instant embodiment, are directed towards providing methods for removing the resist layer 18' from over the semiconductor substrate 10 while not damaging portions of the semiconductor substrate 10 that are not covered by the resist layer 18'. Such a desirable result is often impeded since the ion implanted resist layer 18b is generally more difficult to remove than the base resist layer 18a.

While the preferred embodiment illustrates the invention within the context of removal of a resist layer 18' that includes an ion implanted resist layer 18b located upon a base resist layer 18a, neither the embodiment nor the invention is necessarily so limited. Rather, the embodiment and the invention also contemplate removal of resist layers that have been surface treated using other than ion implant surface treatments. Surface treatments other than ion implant surface treatments may include, but are not necessarily limited to, plasma surface treatments.

Figure 3:
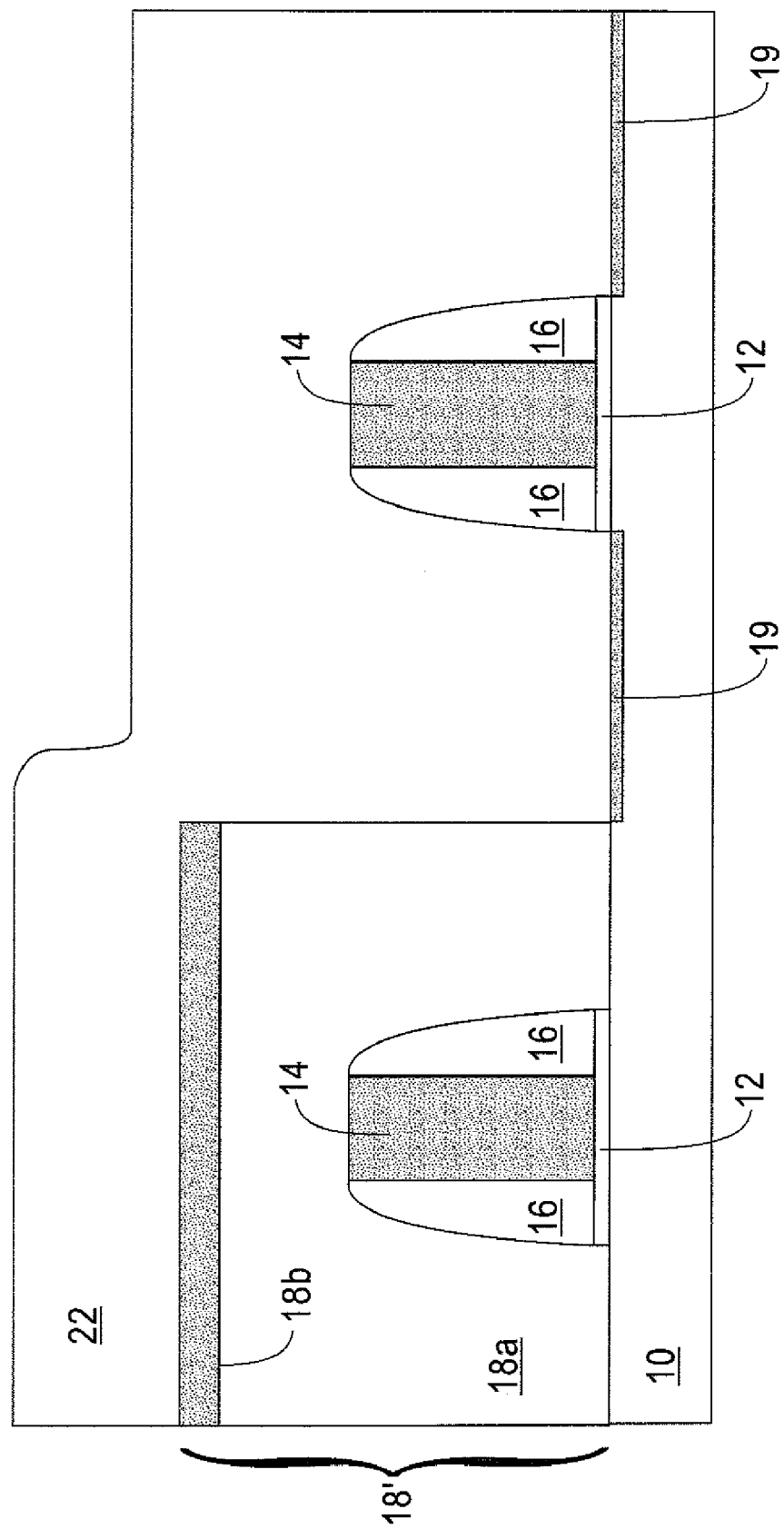

In that regard, FIG. 3 shows the results of further processing of the semiconductor structure of FIG. 2. More particularly, FIG. 3 shows a backfilling material layer 22 located at least adjacent (i.e., laterally adjacent), and preferably adjoining (i.e. laterally adjoining), the resist layer 18'. The backfilling material layer 22 may comprise any of several backfilling materials. Included in particular are dielectric backfilling materials, organic polymer backfilling materials and resist backfilling materials. The foregoing dielectric backfilling materials may include, but are not necessarily limited to polysilsesquioxane, polycarbosilane and carbon doped oxide dielectric backfilling materials (i.e., the later dielectric backfilling material comprising a comparatively low (for example, less than half) silicon concentration in comparison with silicon dioxide). These particular dielectric backfilling materials may be formed using methods including but not limited to spin-on methods, chemical vapor deposition methods and plasma enhanced chemical vapor deposition methods. Non-limiting examples of organic polymer backfilling materials include polyarylene, polyarylene ether, amorphous carbon, near frictionless carbon and diamond like carbon organic polymer backfilling materials, where in general the foregoing organic polymer backfilling materials may be formed using methods analogous to the methods that are used for forming the foregoing dielectric backfilling materials. Resist backfilling materials may include, but are not necessarily limited to resist materials from which may be comprised the resist layer 18 that is illustrated in FIG. 1. Particularly included are 193 nm, 248 nm, extreme ultraviolet (EUV) resist materials that may be either positive acting, negative acting or hybrid positive and negative acting resist materials.

Preferably the backfilling material layer 22 comprises a resist backfilling material that may be analogous, equivalent or identical to the resist material from which is comprised the resist layer 18 that is illustrated in FIG. 1. As is further illustrated within the schematic cross-sectional diagram of FIG. 3, the backfilling material layer 22 is also preferably formed over the resist layer 18'. Typically, the backfilling material layer 22 comprises a resist material analogous to the resist material from which is comprised the resist layer 18 or 18', or alternatively an organic polymer material analogous to the resist material from which is comprised the resist layer 18 or 18', either of which may be formed to a thickness from about 500 to about 3000 angstroms while covering the resist layer 18'.

Figure 4:
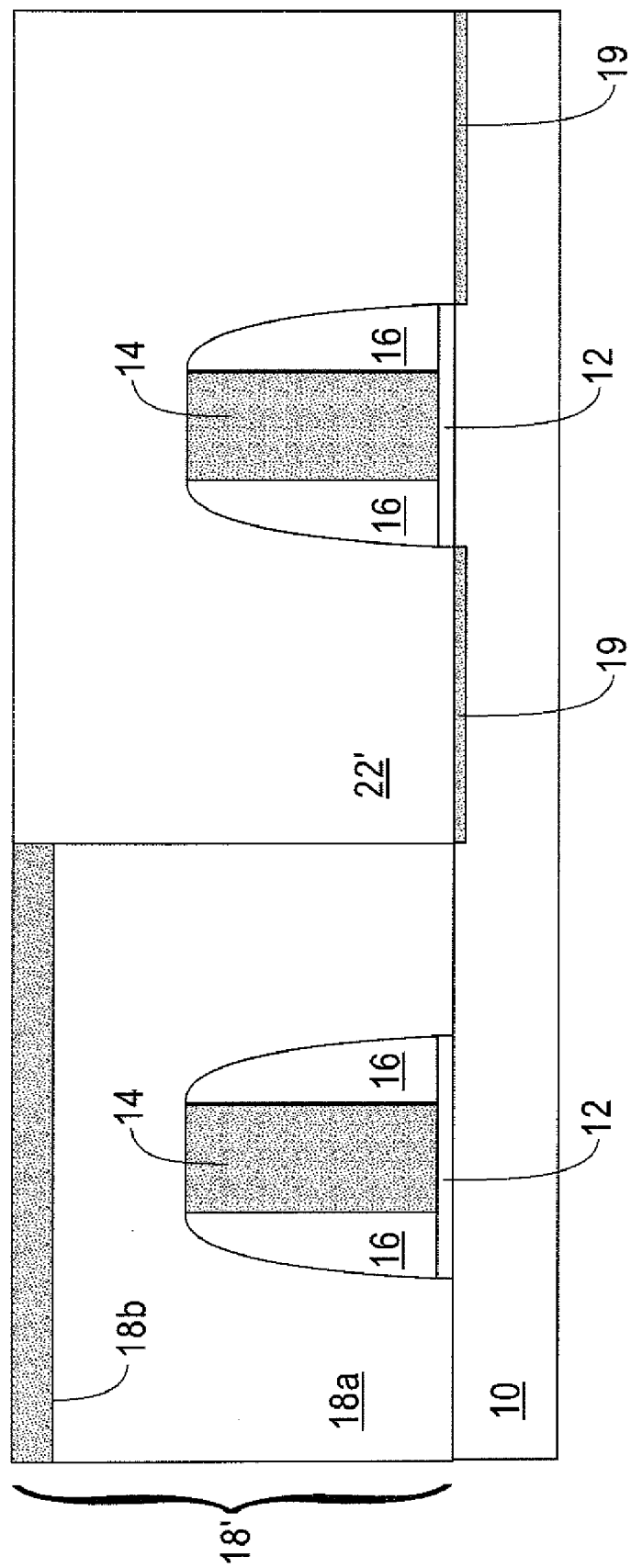

FIG. 4 shows the results of planarizing the backfilling material layer 22 to form a backfilling material layer 22'. Such planarization may be effected using methods and materials that are otherwise generally conventional in the microelectronic fabrication art, including in particular the semiconductor fabrication art. Particular candidate methods for planarizing the backfilling material layer 22 to form the backfilling material layer 22' include reactive ion etch etchback planarizing methods and materials, as well as mechanical planarizing methods and materials, and also chemical mechanical polish planarizing methods and materials. The foregoing planarization is effected preferably to provide the resist layer 18' and the backfilling material layer 22' of nominally equivalent height over the semiconductor substrate 10. Under such circumstances, the ion implanted resist layer 18b may serve as an endpoint detection layer within a reactive ion etch etchback method. Alternatively, the ion implanted resist layer 18b may serve as a planarizing stop layer within a mechanical planarizing method or a chemical mechanical polish planarizing method.

Figure 5:
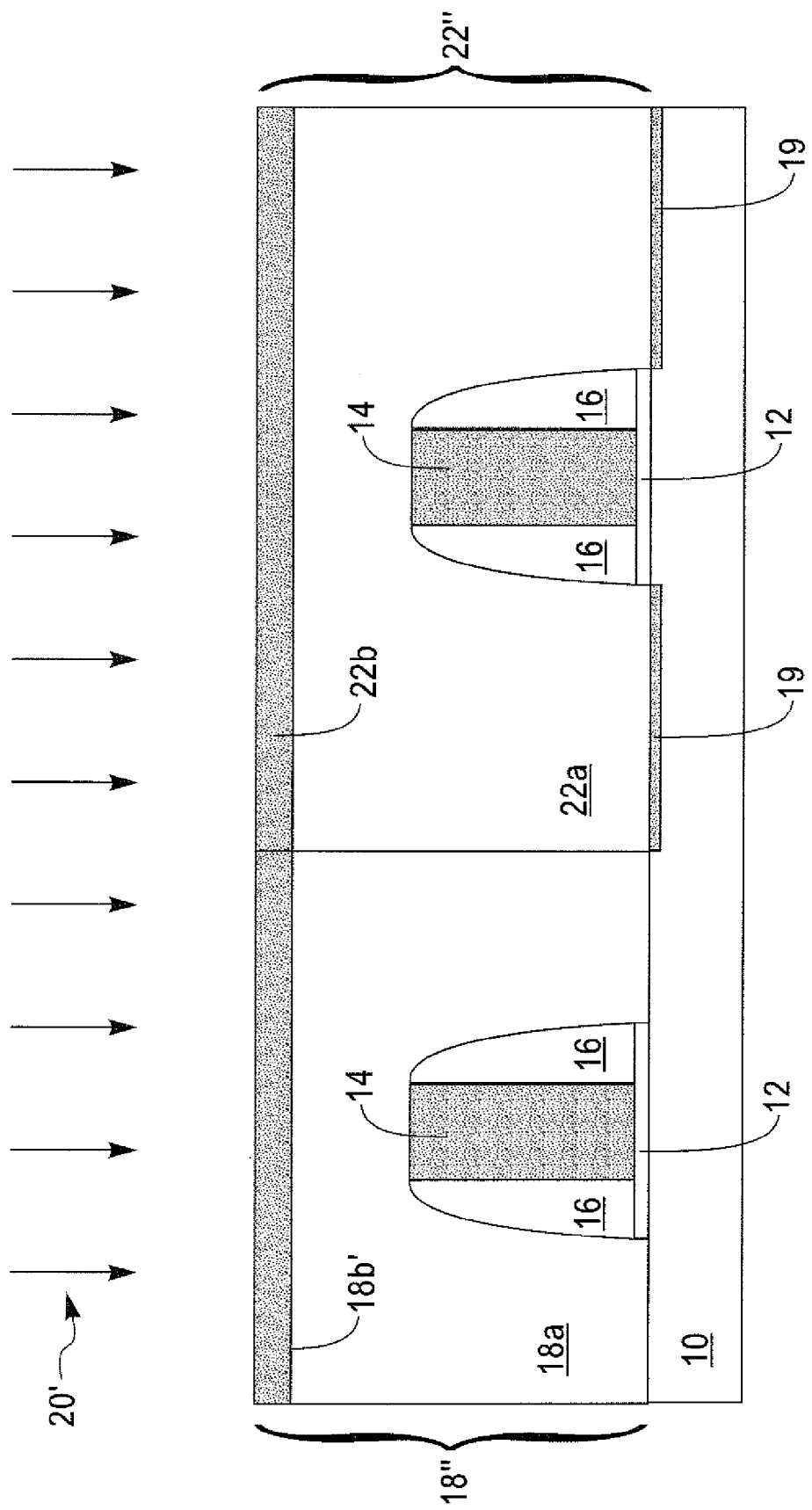

FIG. 5 shows the results of treating the backfilling material layer 22' with a second implanting ion beam 20', to form a backfilling material layer 22" that in turn includes an ion implanted backfilling material layer 22b that is located upon a base backfilling material layer 22a. When treating the backfilling material layer 22' to form the backfilling material layer 22", the resist layer 18' is further treated to form the resist layer 18" that includes an ion implanted resist layer 18b', rather than the ion implanted resist layer 18b, located upon the base resist layer 18a.

The treating of the backfilling material layer 22' to form the backfilling material layer 22", and the resist layer 18' to form the resist layer 18", is typically effected using the second implanting ion beam 20' within a method analogous, equivalent or identical to the ion implanting method that is used for forming the resist layer 18' that is illustrated in FIG. 2 from the resist layer 18 that is illustrated in FIG. 1. To that end, the backfilling material layer 22' and the resist layer 18' are within the context of the instant embodiment treated with the second implanting ion beam 20', while preferably but not necessarily exclusively to provide the ion implanted backfilling material layer 22b with properties (such as in particular reactive ion etch properties) similar (such as within 20 percent) to the properties of the ion implanted resist layer 18b'. To that end, the second implanting ion beam 20' may be provided at a dose in a range from about 1E13 to about 1E16 implanting dopant ions per square centimeter of semiconductor substrate 10 surface area.

Figure 6:
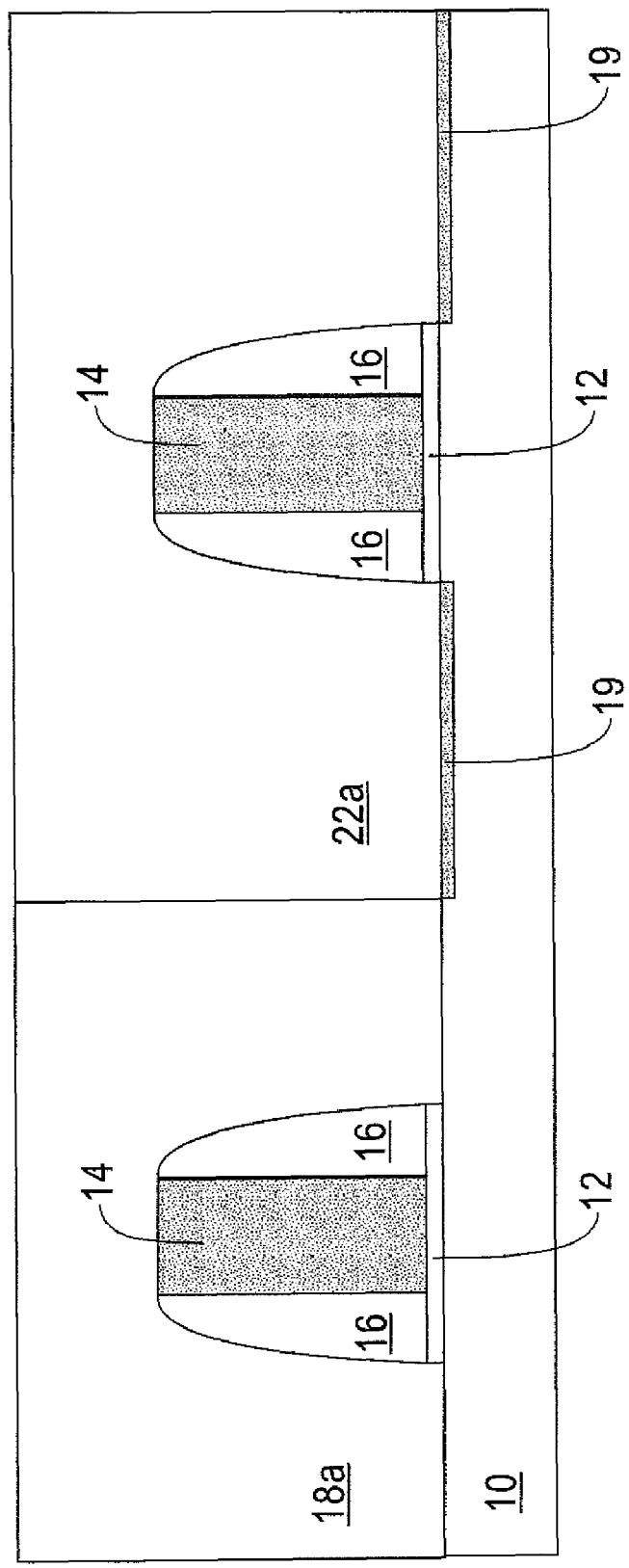

FIG. 6 shows the results of simultaneously stripping the ion implanted resist layer 18b' from the base resist layer 18a and the ion implanted backfilling material layer 22b from the base backfilling material layer 22a. The foregoing stripping may be effected using methods and materials that are generally conventional in the semiconductor fabrication art. Included in particular are wet chemical etch methods and dry plasma etch methods. An appropriate, but not necessarily exclusive, dry plasma etch method may include an etchant gas composition that comprises an oxygen containing etchant gas (i.e., diatomic oxygen, ozone, moisture, nitrous oxide and/or nitric oxide), a hydrogen containing etchant gas (i.e., diatomic hydrogen, hydrazine, moisture and/or ammonia), a nitrogen hydrogen containing etchant gas (i.e., diatomic nitrogen, hydrazine, nitrous oxide, nitric oxide and/or ammonia) and a fluorine and carbon containing etchant gas (i.e., $C_1$ to $C_6$ perfluorocarbons and hydrofluorocarbons).

Preferably, such a dry plasma etch method may also use: (1) a reactor chamber pressure from about 0.4 to about 2 torr; (2) a source radio frequency power from about 1000 to about 5000 watts; (3) a bias power of up to about 1000 watts; (4) an oxygen containing etchant gas flow rate from about 5000 to about 15000 standard cubic centimeters per minute; (5) a hydrogen containing etchant gas flow rate from about 5000 to about 15000 standard cubic centimeters per minute; (6) a nitrogen containing etchant gas flow rate from about 5000 to about 15000 standard cubic centimeters per minute and (7) a fluorine and carbon containing etchant gas flow rate from about 0 to about 100 standard cubic centimeters per minute.

Figure 7:
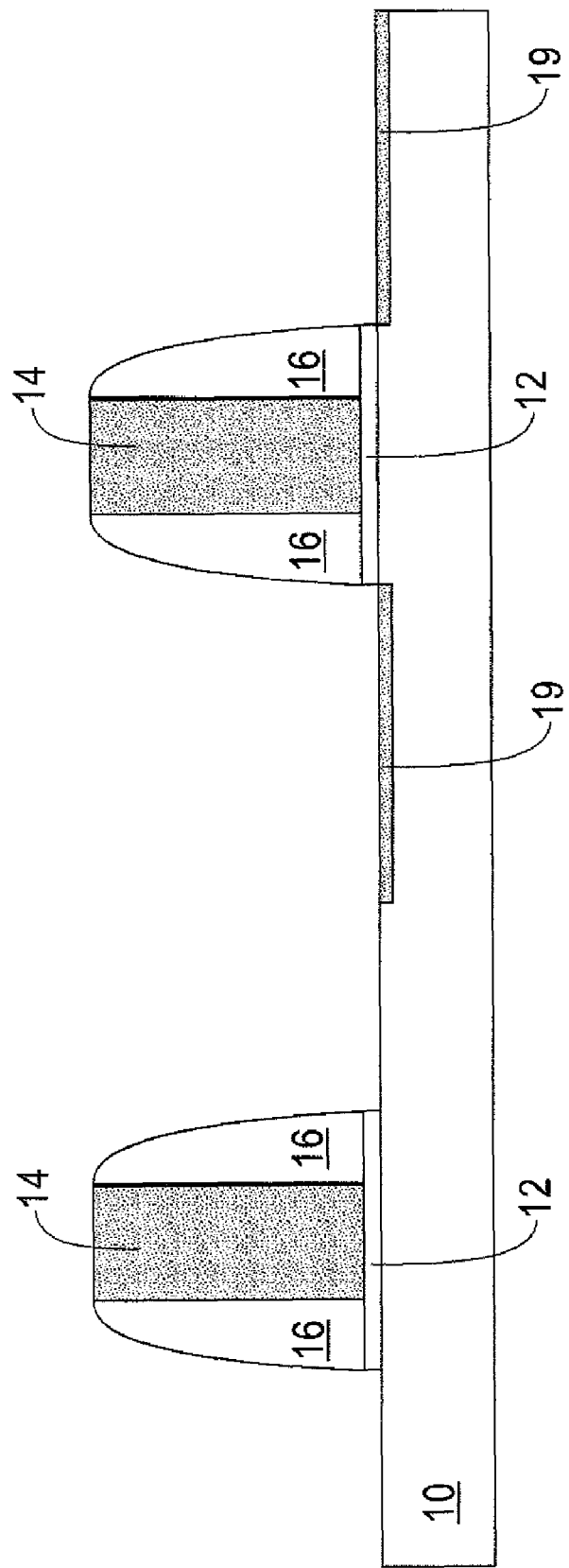

FIG. 7 shows the results of stripping the base resist layer 18a and the base backfilling material layer 22a from the semiconductor structure of FIG. 6. The base resist layer 18a and the base backfilling material layer 22a are also typically simultaneously stripped while using methods and materials that are otherwise generally conventional in the semiconductor fabrication art. Such methods may again include, but again are not necessarily limited to, wet chemical etch methods and dry plasma etch methods.

Particular wet chemical etch methods may include, but are not necessarily limited to the use of: (1) strongly oxidizing acids such as but not limited to aqueous nitric acid and/or aqueous sulfuric acid; as well as (2) aqueous hydrogen peroxide; and/or (3) wet chemical solvents such as but not limited to acetone and n-methylpyrrolidone. The foregoing materials may also be used as an alternative or as an adjunct to the first plasma etch method described above.

Within the context of this particular embodiment, a particular dry plasma etch method may comprise a second plasma etch method that may use an etchant gas composition that includes an oxygen containing etchant gas, a nitrogen containing etchant gas, a hydrogen containing etchant gas each as noted above within the context of the first plasma etch method, but without a fluorine and carbon containing etchant gas in accordance with the first plasma etch method. Preferably, such a second plasma etch method may also use: (1) a reactor chamber pressure from about 0.4 to about 2 torr; (2) a source radio frequency power from about 1000 to about 5000 watts; (3) a bias power of up to about 1000 watts; (4) an oxygen containing etchant gas flow rate from about 5000 to about 15000 standard cubic centimeters per minute; (5) a nitrogen containing etchant gas flow rate from about 5000 to about 15000 standard cubic centimeters per minute; and (6) a hydrogen containing etchant gas flow rate from about 5000 to about 15000 standard cubic centimeters per minute.

Subsequent to stripping the base resist layer 18a and the base backfilling material layer 22a from the semiconductor structure of FIG. 6 to provide the semiconductor structure of FIG. 7, the semiconductor structure of FIG. 7 may be further fabricated to provide a fully functional semiconductor structure. Such further fabrication may desirably result in the fabrication of a complementary metal oxide semiconductor (CMOS) structure from the semiconductor structure whose schematic cross-sectional diagram is illustrated in FIG. 7.

FIG. 7 shows a schematic cross-sectional diagram of a semiconductor structure fabricated in accordance with a particular method that comprises a first embodiment of the invention. The particular method for fabrication of the semiconductor structure whose schematic cross-sectional diagram is illustrated in FIG. 7 includes the use of a resist layer as an ion implantation mask layer located over the semiconductor substrate 10. In order to strip the resist layer that has been used as the ion implantation mask layer located over the semiconductor substrate 10, a backfilling material layer is first formed and located at least adjacent, and preferably adjoining, the resist layer. The backfilling material layer is preferably planarized, and then ion implant treated analogously, equivalently or identically with the resist layer. Ion implanted surface portions and underlying base portions of the resist layer and the backfilling material layer may then be sequentially stripped using a two step stripping method. When using a two step plasma etch stripping method, a first step may use a first etchant gas composition that includes a fluorine and carbon containing etchant gas in addition to an oxygen containing etchant gas, a hydrogen containing etchant gas and a nitrogen containing etchant gas. In contrast thereto, a second step within the two step plasma etch method may use a second etchant gas composition that includes the oxygen containing etchant gas, the hydrogen containing etchant gas and the nitrogen containing etchant gas, but absent the fluorine and carbon containing etchant gas. The use of the backfilling material layer at least adjacent, and preferably adjoining, the resist layer, avoids damage to a portion of the semiconductor substrate 10 that would otherwise be uncovered when stripping the resist layer from over the semiconductor substrate 10.

Figure 8:
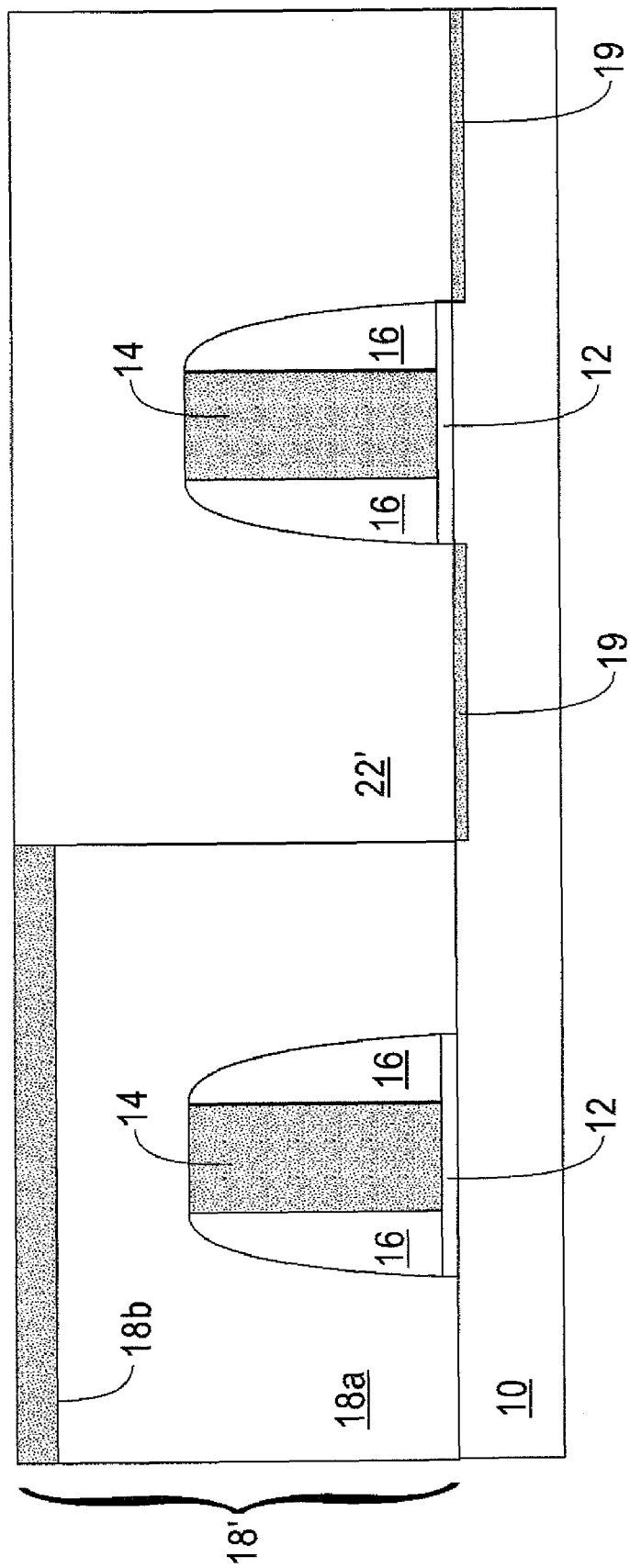
FIG. 8 to FIG. 12 show a series of schematic cross-sectional diagrams illustrating the results of progressive stages in fabricating a semiconductor structure in accordance with another particular embodiment of the invention.

FIG. 8 to FIG. 12 show a series of schematic cross-sectional diagrams illustrating the results of progressive stages in fabricating a semiconductor structure while using a method in accordance with another embodiment of the invention. This other embodiment of the invention comprises a second embodiment of the invention. FIG. 8 shows a schematic cross-sectional diagram of the semiconductor structure at an early stage in the fabrication thereof in accordance with this other embodiment of the invention.

FIG. 8 shows a schematic cross-sectional diagram of a semiconductor structure that is analogous, equivalent or (preferably) identical to the semiconductor structure whose schematic cross-sectional diagram is illustrated in FIG. 4. Like or identical structures are designated with identical reference numerals.

Figure 9:
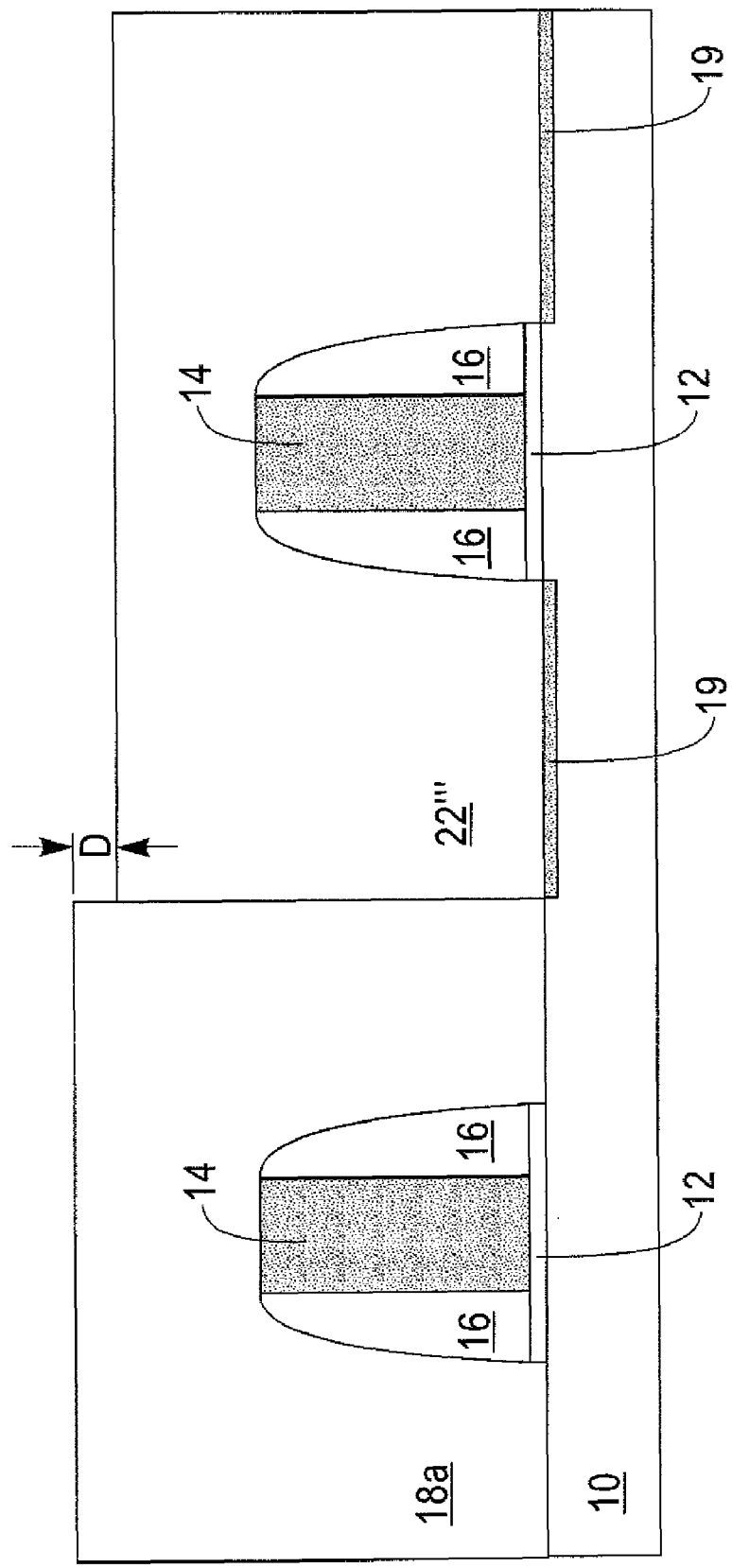

FIG. 9 shows the results of stripping the ion implanted resist layer 18b from the base resist layer 18a absent first forming an ion implanted backfilling material layer and a base backfilling material layer from the backfilling material layer 22'. As a result the backfilling material layer 22" that is illustrated in FIG. 8 is etched by a distance D of up to about 1500 angstroms beneath the base resist layer 18a to form a backfilling material layer 22'''. The foregoing etching may be effected using a wet chemical etch method or a dry plasma etch method that is otherwise generally conventional in the semiconductor fabrication art. In particular, such a wet chemical etch method or dry plasma etch method may in particular include a dry plasma etch method analogous, equivalent or identical to the first dry plasma etch method that is used for forming the semiconductor structure whose schematic cross-sectional diagram is illustrated in FIG. 6 from the semiconductor structure whose schematic cross-sectional diagram is illustrated in FIG. 5.

Figure 10:
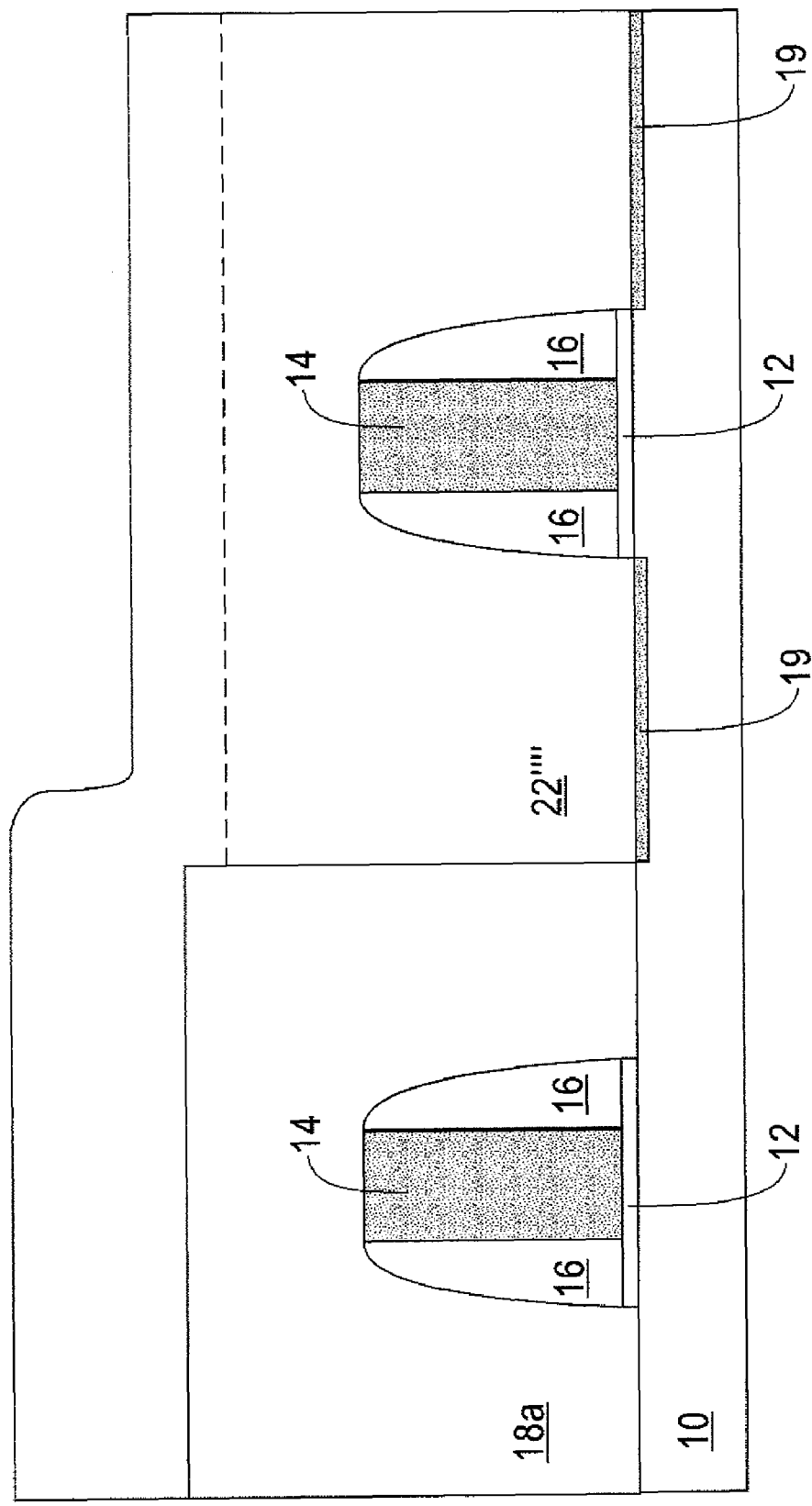

FIG. 10 shows a backfilling material layer 22'''' that results from augmentation of the backfilling material layer 22''' that is illustrated in FIG. 9. Generally, the augmented backfilling material layer 22'''' comprises the same backfilling material as the backfilling material layer 22''' that is illustrated in FIG. 9. As is illustrated within the schematic cross-sectional diagram of FIG. 10, the augmented backfilling material layer 22'''' covers a portion of the base resist layer 18*a*.

Figure 11:
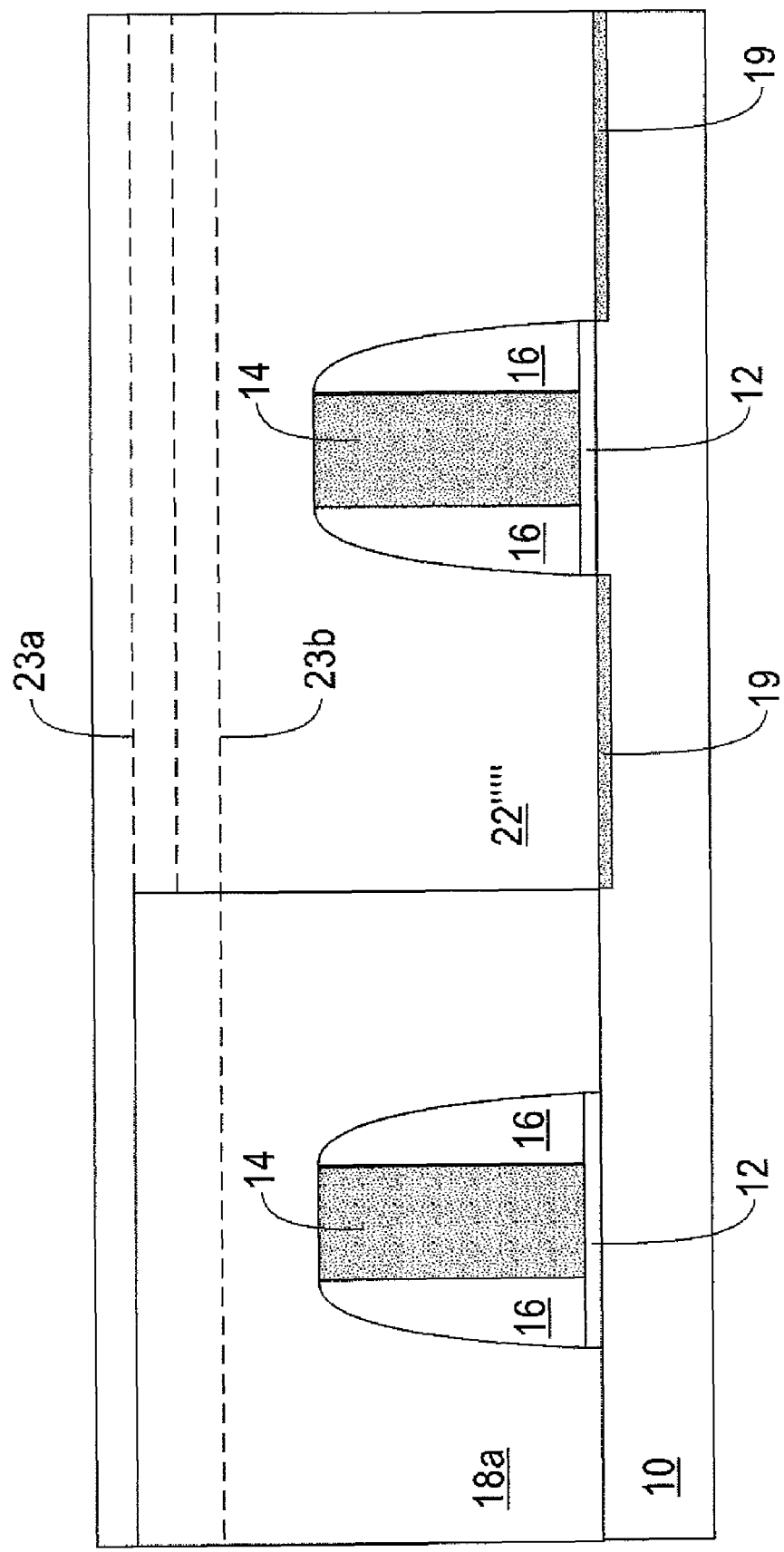

FIG. 11 shows the results of planarizing (by methods outlined in progressing from the semiconductor structure depicted in FIG. 3 to the semiconductor structure depicted in FIG. 4) the augmented backfilling material layer 22'''' that is illustrated in FIG. 10 to form a planarized backfilling material layer 22'''''. As is illustrated in FIG. 11, the planarizing of the augmented backfilling material layer 22'''' to form the planarized backfilling material layer 22''''' provides that some of the planarized backfilling material layer 22''''' still remains over the base resist layer 18*b*. In an alternative, and as is illustrated within the context of the phantom lines that correspond with reference numerals 23*a* and 23*b*, the augmented backfilling material layer 22'''' that is illustrated within FIG. 10 may be nominally coplanarized with respect to the base resist layer 18*b* (i.e., reference numeral 23*a*) or both the base resist layer 18*b* and the augmented backfilling material layer 22'''' (or the non-augmented backfilling material layer 22''' that is illustrated in FIG. 9) may be further co-planarized to identical but nonetheless lesser thicknesses (i.e., reference numeral 23*b*).

Figure 12:
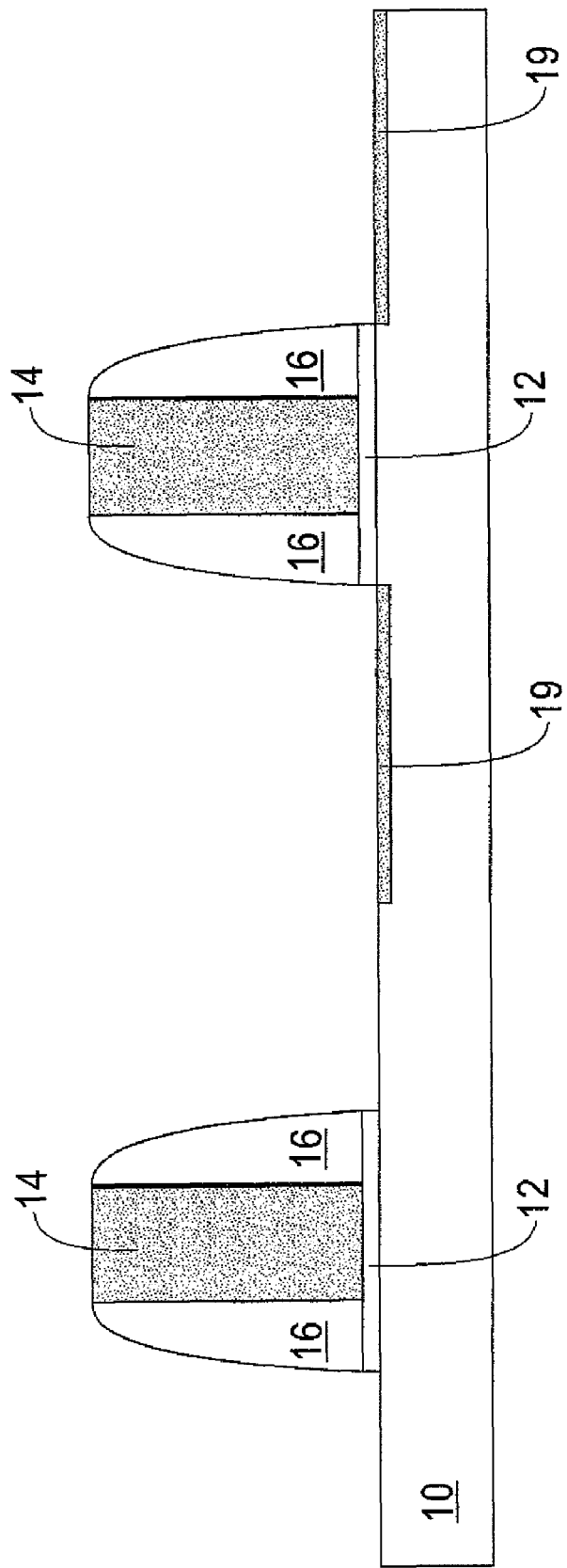

FIG. 12 show the results of stripping the base resist layer 18*a* and the backfilling material layer 22''''' from the semiconductor structure of FIG. 11. The base resist layer 18*a* and the backfilling material layer 22''''' may be stripped from the semiconductor structure of FIG. 11 to provide the semiconductor structure of FIG. 12 while using a wet chemical stripping method or a dry plasma stripping method analogous equivalent or identical to a wet chemical stripping method or a dry plasma stripping method that is used for stripping the base resist layer 18*a* and the base backfilling material layer 22*a* from the semiconductor structure of FIG. 6 to provide the semiconductor structure of FIG. 7. In particular, such stripping may use a second plasma etch method analogous, equivalent or identical to the second plasma etch method that is preferably used for forming the semiconductor structure whose schematic cross-sectional diagram is illustrated in FIG. 7 from the semiconductor structure whose schematic cross-sectional diagram is illustrated in FIG. 6.

FIG. 12 shows a schematic cross-sectional diagram of a semiconductor structure fabricated using a method in accordance with a second embodiment of the invention. The semiconductor structure of FIG. 12 is otherwise generally analogous, equivalent or identical to the semiconductor structure that is illustrated in FIG. 7. To provide the semiconductor structure of FIG. 12, the method in accordance with the second embodiment provides for forming a backfilling material layer at least adjacent, and preferably adjoining, a resist layer that includes an ion implanted resist layer located upon a base resist layer in turn located over a semiconductor substrate 10. Within the second embodiment, the backfilling material layer does not include an ion implanted backfilling material layer located upon a base backfilling material layer. The ion implanted resist layer is stripped from the base resist layer while using a first etch method that may comprise a plasma etch method that uses a fluorine and carbon containing etchant gas to provide a base resist layer and an etched backfilling material layer of lesser thickness than the base resist layer. The base resist layer and the etched backfilling material layer are then replanarized prior to being simultaneously removed using a second etch method. The second etch method may include a second plasma etch method that does not include a fluorine and carbon containing etchant gas, in accordance with the second plasma etch method that is used for forming within the first embodiment the semiconductor structure whose schematic cross-sectional diagram is illustrated in FIG. 7 from the semiconductor structure whose schematic cross-sectional diagram is illustrated in FIG. 6.

The preferred embodiments are illustrative of the invention rather than limiting of the invention. Revisions and modifications may be made to methods, materials, structures and dimensions of a semiconductor structure in accordance with the preferred embodiments while still providing an embodiment of a method in accordance with the invention, further in accordance with the accompanying claims.

What is claimed is:

1. A method for fabricating a microelectronic structure comprising:

forming a backfilling material layer at least laterally adjacent a surface treated resist layer, wherein the backfilling material layer and the surface treated resist layer cover an entire upper surface of a substrate, wherein the surface treated resist layer includes an n-type or p-type doped first upper surface;

surface treating the backfilling material layer to form a surface treated backfilling material layer at least laterally adjacent the surface treated resist layer, wherein the surface treated backfilling material layer includes an n-type or p-type doped second upper surface; and simultaneously etching the n-type or p-type doped first upper surface selective to an underlying portion of the surface treated resist layer and the n-type or p-type doped second upper surface selective to an underlying portion of the backfilling material layer with a first etch chemistry using a fluorine and carbon containing etchant gas; and simultaneously etching the underlying portion of the surface treated resist layer and the underlying portion of the backfilling material layer with a second etch chemistry that is selective to the substrate, wherein the second etch chemistry does not include fluorine and carbon containing etchant gas.

2. The method of claim 1 wherein the substrate comprises a semiconductor substrate.

3. The method of claim 1 wherein the substrate comprises a ceramic substrate.

4. The method of claim 1 wherein the backfilling material layer comprises a polymer material.

5. The method of claim 1 wherein the backfilling material layer comprises a resist material.

6. The method of claim 1, wherein the n-type or p-type doped first upper surface of the surface treated resist layer is formed prior to forming the backfilling material layer by an implantation step that forms source and drain regions in a portion of the substrate that is not covered by the surface treated resist layer, wherein the backfilling material layer is formed overlying at least the source and drain regions.

7. The method of claim 1, wherein the fluorine and carbon containing etchant gas comprises $C_1$ to $C_6$ perfluorocarbons, hydrofluorocarbons or combinations thereof.

8. The method of claim 7, wherein the first etch chemistry further comprises at least one of:

an oxygen containing etchant gas selected from the group consisting of diatomic oxygen, ozone, moisture, nitrous oxide, nitric oxide and combinations thereof;

a hydrogen containing etchant gas selected from the group consisting of diatomic hydrogen, hydrazine, moisture, ammonia and combinations thereof; and a nitrogen hydrogen containing etchant gas selected from the group consisting of diatomic nitrogen, hydrazine, nitrous oxide, nitric oxide, ammonia and combinations thereof.

9. The method of claim 8, wherein the second etch chemistry comprises at least one of:

an oxygen containing etchant gas selected from the group consisting of diatomic oxygen, ozone, moisture, nitrous oxide, nitric oxide and combinations thereof;

a hydrogen containing etchant gas selected from the group consisting of diatomic hydrogen, hydrazine, moisture, ammonia and combinations thereof; and a nitrogen hydrogen containing etchant gas selected from the group consisting of diatomic nitrogen, hydrazine, nitrous oxide, nitric oxide, ammonia and combinations thereof.

10. The method of claim 8, wherein the second etch chemistry comprises aqueous nitric acid, aqueous sulfuric acid, aqueous hydrogen peroxide, acetone, n-methyl pyrrolidone or a combination thereof.

11. A method for fabricating a microelectronic structure comprising:

forming a backfilling material layer at least laterally adjacent a surface treated resist layer located over an entire upper surface of a substrate, wherein the surface treated resist layer includes an n-type or p-type doped first upper surface;

stripping the n-type or p-type doped first upper surface from the surface treated resist layer while using the backfilling material layer as a mask over the laterally adjacent portion of the substrate using a first etch method comprising a fluorine and carbon containing etchant gas;

planarizing a remaining portion of the surface treated resist layer and a remaining portion of the backfilling material layer located over the substrate; and stripping simultaneously the remaining planarized portions of the resist layer and the backfilling material layer from over the substrate while using a second etch method that does not include fluorine and carbon containing etchant gas.

12. The method of claim 11 wherein the planarizing leaves planarized portions of both the resist layer and the backfilling material layer exposed.

13. The method of claim 11 wherein the backfilling material layer comprises a polymer material.

14. The method of claim 11 wherein the backfilling material layer comprises a resist material.

15. The method of claim 11, wherein the n-type or p-type doped first upper surface of the surface treated resist layer is formed prior to forming the backfilling material layer by an implantation step that forms source and drain regions in a portion of the substrate that is not covered by the surface treated resist layer, wherein the backfilling material layer is formed overlying at least the source and drain regions.

16. The method of claim 11, wherein the fluorine and carbon containing etchant gas comprises $C_1$ to $C_6$ perfluorocarbons, hydrofluorocarbons or combinations thereof.

17. The method of claim 16, wherein the first etch method further comprises at least one of:

an oxygen containing etchant gas selected from the group consisting of diatomic oxygen, ozone, moisture, nitrous oxide, nitric oxide and combinations thereof;

a hydrogen containing etchant gas selected from the group consisting of diatomic hydrogen, hydrazine, moisture, ammonia and combinations thereof; and a nitrogen hydrogen containing etchant gas selected from the group consisting of diatomic nitrogen, hydrazine, nitrous oxide, nitric oxide, ammonia and combinations thereof.

18. The method of claim 17, wherein the second etch method comprises at least one of:

an oxygen containing etchant gas selected from the group consisting of diatomic oxygen, ozone, moisture, nitrous oxide, nitric oxide and combinations thereof;

a hydrogen containing etchant gas selected from the group consisting of diatomic hydrogen, hydrazine, moisture, ammonia and combinations thereof; and a nitrogen hydrogen containing etchant gas selected from the group consisting of diatomic nitrogen, hydrazine, nitrous oxide, nitric oxide, ammonia and combinations thereof.

19. The method of claim 17, wherein the second etch method comprises aqueous nitric acid, aqueous sulfuric acid, aqueous hydrogen peroxide, acetone, n-methyl pyrrolidone or a combination thereof.

\* \* \* \* \*